United States Patent
Lebouleux

(10) Patent No.: US 6,693,496 B1
(45) Date of Patent: Feb. 17, 2004

(54) METHOD AND SYSTEM FOR LOW POWER, LOW JITTER, WIDE RANGE, SELF-ADAPTIVE MULTI-FREQUENCY PHASE LOCKED LOOP

(75) Inventor: Nicolas Lebouleux, Alameda, CA (US)

(73) Assignee: Genesis Microchip Inc., Alviso, CA (US)

( * ) Notice: Subject to any disclaimer, the term of this patent is extended or adjusted under 35 U.S.C. 154(b) by 0 days.

(21) Appl. No.: 10/098,758

(22) Filed: Mar. 13, 2002

(51) Int. Cl.[7] .............................. H03B 1/00; H03L 7/00
(52) U.S. Cl. ......................... 331/185; 331/17; 331/25; 327/147; 327/156
(58) Field of Search .................... 331/185, 10, 17, 331/25; 327/115, 117, 156, 147, 150, 159

(56) References Cited

U.S. PATENT DOCUMENTS

| | | | | |
|---|---|---|---|---|
| 3,898,579 A | * | 8/1975 | Aldridge ..................... 331/1 A |
| 4,893,271 A | * | 1/1990 | Davis et al. ................. 713/501 |
| 5,629,650 A | * | 5/1997 | Gersbach et al. ............. 331/17 |
| 5,798,667 A | * | 8/1998 | Herbert ....................... 327/573 |
| 5,963,100 A | * | 10/1999 | Tolson et al. ................. 331/17 |
| 6,081,164 A | * | 6/2000 | Shigemori et al. ............ 331/16 |
| 6,329,882 B1 | * | 12/2001 | Fayneh et al. ................ 331/10 |
| 6,456,165 B1 | * | 9/2002 | Kelkar ......................... 331/17 |
| 6,472,914 B1 | * | 10/2002 | Gu et al. ..................... 327/157 |

* cited by examiner

*Primary Examiner*—Tuan T. Lam
(74) *Attorney, Agent, or Firm*—Beyer Weaver & Thomas LLP

(57) ABSTRACT

A self-adaptive method for controlling a self-biased PLL system is disclosed. The method comprises providing an application-dependent input frequency; and providing an application-dependent number N representing the ratio between the output frequency and the application-dependent input frequency to the PLL system. In a system and method in accordance with the present invention, the bandwidth and damping factor are tracked, not only with the input frequency but with the divider ratio as well. Therefore, jitter is minimized for any operating condition (i.e., input frequency variations [N]). The charge-pump current is made to be proportional to the VCO current $I_D$ and inversely proportional to the frequency range N; and the loop filter resistor is made to be inversely proportional to the square root of the VCO current $I_D$ and proportional to N. In so doing, the bandwidth and damping factors can be tracked more comprehensively.

13 Claims, 7 Drawing Sheets

METHOD AND SYSTEM FOR LOW POWER, LOW JITTER, WIDE RANGE, SELF-ADAPTIVE MULTI-FREQUENCY PHASE LOCKED LOOP

FIELD OF THE INVENTION

The present invention relates generally to a phase locked loop (PLL) and more particularly to a self biased multifrequency PLL.

BACKGROUND OF THE INVENTION

Delay-locked loops (DLLs) and phase-locked loops (PLLs) are often used in the I/O interfaces of digital integrated circuits in order to hide clock distribution delays and to improve overall system timing. In these applications, DLLs and PLLs must closely track the input clock. However, the rising demand for high-speed I/O has created an increasingly noisy environment in which DLLs and PLLs must function. This noise, typically in the form of supply and substrate noise, tends to cause the output clocks of DLLs and PLLs to jitter from their ideal timing. With a shrinking tolerance for jitter in the decreasing period of the output clock, the design of low jitter DLLs and PLLs has become very challenging.

Achieving low jitter in PLL and DLL designs can be difficult due to a number of design tradeoffs. Consider a typical PLL which is based on a voltage controlled oscillator (VCO). The amount of input tracking jitter produced as a result of supply and substrate noise is directly related to how quickly the PLL can correct the output frequency. To reduce the jitter, the loop bandwidth should be set as high as possible. Unfortunately, the loop bandwidth is affected by many process technology factors and is constrained to be well below the lowest operating frequency for stability. These constraints can cause the PLL to have a narrow operating frequency range and poor jitter performance. Although a typical DLL is based on a delay line and thus simpler from a control perspective, it can have a limited delay range which leads to a set of problems similar to that of the PLL.

FIG. 1 illustrates a conventional phase locked loop (PLL) 10. PLL 10 comprises a phase frequency detector (PFD) 12 which receives a feedback frequency and a fixed reference frequency from typically a crystal oscillator. The phase frequency detector 12 provides two output signals, an up signal or a down signal depending on the relationship of the fixed frequency and the feedback frequency. Those signals are provided to charge pump 14 which provides an output to a low pass filter 16 and a voltage controlled oscillator (VCO) 18. The VCO 18 provides an output voltage based upon the frequency. The output voltage is fed back to a counter 20 which is typically a divide by N counter which is used to ensure loop stability. Accordingly, if the phase frequency detector 12 provides an up signal there will be a corresponding increase in the charge pump signal to the VCO 18 to cause the feedback frequency to increase to match it to the fixed frequency. Conversely, if the phase frequency detector 12 provides a down signal there will be a corresponding decrease in the charge pump signal to the VCO 18 which will cause the feedback frequency to decrease, thereby bringing it in line with the crystal.

Loop Equations—Stability

As is well known, the open loop gain ($G_{OL}$) of the PLL can be characterized by the following equation which is shown below:

$$G_{ol} = \frac{Ich \cdot K_0 \cdot (1 + RCs)}{Cs^2}$$

As is well known, the closed loop gain ($G_{CL}$) for PLL is then a second-order system as shown below:

$$G_{cl} = \frac{G_{ol}}{1 + \frac{G_{ol}}{N}} = \frac{N \cdot Ich \cdot K_0 \cdot (1 + RCs)}{NCs^2 + Ich \cdot K_0 \cdot (1 + RCs)} = N \cdot \frac{1 + 2 \cdot \zeta \cdot (s/w_n)}{1 + 2 \cdot \zeta \cdot (s/w_n) + (s/w_n)^2}$$

The loop system can be characterized by two factors, the loop damping factor and the loop bandwidth factor.
The loop damping factor ($\zeta$) is characterized by the equation:

$$\zeta = \frac{RCw_n}{2} = \frac{R}{2}\sqrt{\frac{Ich \cdot K_0 \cdot C}{N}}$$

The loop bandwidth factor ($w_n$) is characterized by the equation:

$$w_n = \sqrt{\frac{Ich \cdot K_0}{NC}}$$

FIG. 2 is a Bode plot which illustrates the open loop gain ($G_{OL}$) and the closed loop gain ($G_{CL}$) for stable and unstable systems respectively. The traditional stability criteria for $G_{OL}$ for the PLL is $G_{ol}$ crossing 0 dB with a −20 db/decade slope so that $$w_n > w_{RC} = \frac{1}{RC}, \text{ then } \zeta > 0 \cdot 5 \text{ because } \frac{w_n}{w_{RC}} = \frac{w_c}{w_n} = 2 \cdot \zeta$$

The open loop gain $G_{OL}$ usually has a distant pole due to parasitic capacitances. Accordingly, the PLL can be unstable if appropriate precautions are not taken. Actually, the stability criteria is more restrictive if it's deduced from differential equation (sampling) but the VCO overload criteria is usually prevailing. That is due to the instantaneous voltage drop on the loop filter.

FIG. 3 illustrates a change of Ich over time. It is known that the VCO overload limit is $$R \cdot Ich < \frac{Fvco}{K_0}.$$

This relationship leads to the following equation:

$$\frac{w_n}{w_{ref}} < \frac{1}{4\pi\zeta}.$$

Accordingly, therefore, $\omega_{ref}$ must be at least $2.\pi$ times away from $\omega_C$ to ensure stability. The optimum damping factor for a critically damped system stability having a minimum settling time is 0.707. So $\omega_{ref}$ then must be 8.88 times away from $\omega_n$ to ensure stability. A safe value for this relationship is that $\omega_{ref}$ is ten (10) times away from $\omega_n$, to filter input frequency noise.

As before mentioned, achieving low jitter in PLL designs can be difficult due to a number of designs tradeoffs. To reduce peak-to-peak jitter due to VCO noise, it is advantageous to keep as high a PLL bandwidth as possible. Traditional charge-pump PLL design would keep the PLL bandwidth and damping factor sufficiently far away from stability limits under all variations of the input reference frequency, the manufacturing process, and the division ratio in the feedback path N. These constraints can cause the PLL to have a narrow operating frequency range and poor jitter performance.

Ideally, both ξ and $$\frac{w_n}{w_{ref}}$$

should be constant so that there is no limit on the operating frequency range and the jitter performance can be improved.

Existing Solutions

A self-biased PLL design technique avoids the necessity for external biasing (bandgap) by generating internal bias voltages and currents depending on the operating conditions. FIG. 4 illustrates a conventional self-biased PLL 100. In the self-biased system of FIG. 4, there is a similar phase frequency detector 101 with two charge pumps 102 and 106, one of which (charge pump 106) provides an output directly to the VCO 105 and the other of which (charge pump 102) provides its output to a low pass filter 103 which in turn provides a signal to a bias generator 104. The bias generator 104 in turn provides an output signal Vbn to the VCO 105, while the charge pump 106 provides an input to the VCO 105 of Vbp. The output V0 of the VCO 105 is fed back to a divide by N counter 108 in a manner similar to that described with reference to FIG. 1. The self-biased PLL design achieves process technology independence, fixed damping factor, fixed bandwidth to operating frequency ratio, broad frequency range, input phase offset cancellation, high supply and substrate noise rejection. Accordingly, this system is advantageous over the system of FIG. 1. However, it does have problems which will be described hereinbelow. Principally, those problems are associated with it being only allowed to operate effectively in a fixed frequency environment.

The following three papers describe some existing self-biased PLLs:

References

[1] *Low-jitter Process-Independent DLL and PLL Based on Self-biased Techniques*, John G. Maneatis, IEEE Journal of Solid State Circuits, Vol.31, No.11, November 1996.

[2] *Adaptive Bandwidth DLLs and PLLs using Regulated Supply CMOS Buffers*, S.Sidiropoulos, D.Liu, J.Kim, G.Wei, M.Horowitz—Rambus Inc. and Standford University, IEEE 2000.

[3] *A 2–1600-MHz 1.2–2.5V CMOS Clock Recovery PLL with Feedback Phase-Selection and Averaging Phase-Interpolation for Jitter Reduction*, Patrick Larsson, 1999 IEEE International Solid State Circuits Conference, Vol.34, No.12, December 1999.

As before mentioned, these solutions do not affect frequency range variations associated with N. They only provide a fixed bandwidth independent of the frequency range.

Accordingly, what is needed is a system and method for providing a PLL which can operate effectively over a wide range of frequencies. The system should be easy to implement in existing systems and be cost effective. The present invention addresses such a need.

SUMMARY OF THE INVENTION

A self-adaptive method for controlling a self-biased PLL system is disclosed. The method comprises providing an application-dependent input frequency; and providing an application-dependent number N representing the ratio between the output frequency and the application-dependent input frequency to the PLL system.

In a system and method in accordance with the present invention, the bandwidth and damping factor are tracked, not only with the input frequency but with the divider ratio as well. Therefore, jitter is minimized for any operating condition (i.e., input frequency variations associated with an application-dependent number N representing the ratio between the output frequency and the application-dependent input frequency to the PLL system). The charge-pump current is made to be proportional to the VCO current ID and inversely proportional to the frequency range associated with N; and the loop filter resistor is made to be inversely proportional to the square root of the VCO current ID and proportional to N. In so doing, the bandwidth and damping factors can be tracked more comprehensively.

DETAILED DESCRIPTION

The present invention relates generally to a phase locked loop (PLL) and more particularly to providing a lower power low jitter multifrequency synthesizer. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

In a system and method in accordance with the present invention, the bandwidth and damping factor are tracked, not only with the input frequency but with the divider ratio as well. Therefore, jitter is minimized for any operating condition (i.e., input frequency variations associated with an application-dependent number N representing the ratio between the output frequency and the application-dependent input frequency to the PLL system). The charge-pump current is made to be proportional to the VCO current $I_D$ and inversely proportional to the frequency range associated with N; and the loop filter resistor is made to be inversely proportional to the square root of the VCO current $I_D$ and proportional to N. In so doing, the bandwidth and damping factors can be tracked more comprehensively.

Assume that X is the charge-pump current to VCO current ratio, and Y is the resistor to square root VCO current ratio. Accordingly, X is proportional to 1/N and Y is proportional to N.

1. VCO Overload Limit

When the charge-pump is sinking or sourcing a current Ich, the instantaneous voltage drop at the input of the VCO should not exceed its operating range. The VCO overload limit is then $$R \cdot Ich < \frac{Fvco}{K_0}$$

Considering [1] eq. (17)–(20), $$F_{VCO} = \frac{\sqrt{2 \cdot k \cdot I_D}}{C_B},$$

$$K_0 = \frac{k}{C_B}$$

$$Ich = X \cdot (2 \cdot I_D) = \frac{\alpha}{N} \cdot (2 \cdot I_D)$$

$$R = \frac{Y}{\sqrt{8 \cdot k \cdot I_D}} = \frac{\beta \cdot N}{\sqrt{8 \cdot k \cdot I_D}}$$

The overload limit becomes $$\frac{X \cdot Y \cdot 2 \cdot I_D}{\sqrt{8 \cdot k \cdot I_D}} < \frac{\sqrt{2 \cdot k \cdot I_D}}{C_B} \times \frac{C_B}{k} \text{ thus, } \underline{X \cdot Y < 2}$$

2. Charge-pump Current Versus Loop Filter Resistance

Figure 7:
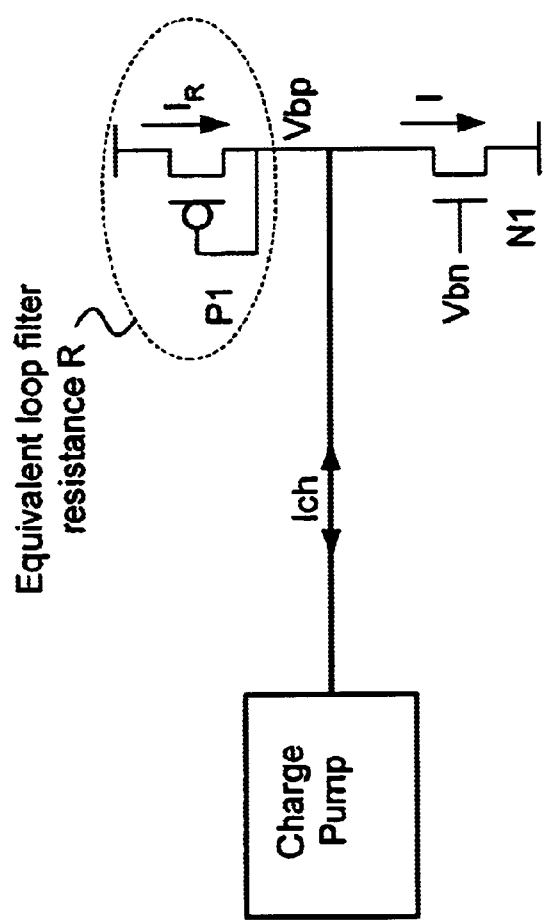
FIG. 7 illustrates a charge pump coupled to the diode connected loads in the resistor generator.

The loop filter resistance generator is basically designed with diode connected PMOS loads. FIG. 7 illustrates a charge pump coupled to the diode connected loads. In this type of arrangement, the PMOS load must always have a positive current $I_R$ flowing through it. When the charge-pump is sinking a current Ich in UP mode, $I_R$=I+Ich. When the charge-pump is sourcing a current Ich in DOWN mode, $I_R$=I−Ich. Therefore, I must be greater than Ich in any case. I is made proportional to $I_D$ because NMOS N1 is connected to VBN. Let's say I=A.$I_D$ $$R = \frac{1}{gm_{P1}} = \frac{1}{\sqrt{2 \cdot k_{P1} \cdot I_R}} = \frac{Y}{\sqrt{8 \cdot k \cdot I_D}}$$

However, when Ich=0 in steady state, PMOS P1 sources $I_R$=A.$I_D$ and VBP must remain constant and equal to its value.

Then $$\frac{A \cdot I_D}{k_{P1}} = \frac{I_D}{k} \text{ because } I_D = k \cdot \frac{W}{L} \cdot (V_{GS} - V_t)^2$$

so $V_{GS}$ is conserved.

Replacing in the above R equation also $I_R$ by A.$I_D$, $$A = \frac{2}{Y}$$

Therefore, Ich=X.(2.$I_D$)

Therefore, I has to be greater than Ich if $$A \cdot I_D > X \cdot (2 \cdot I_D)$$

$$A > 2 \cdot X, \text{ so } \underline{X \cdot Y \leq 1}$$

Figure 1:
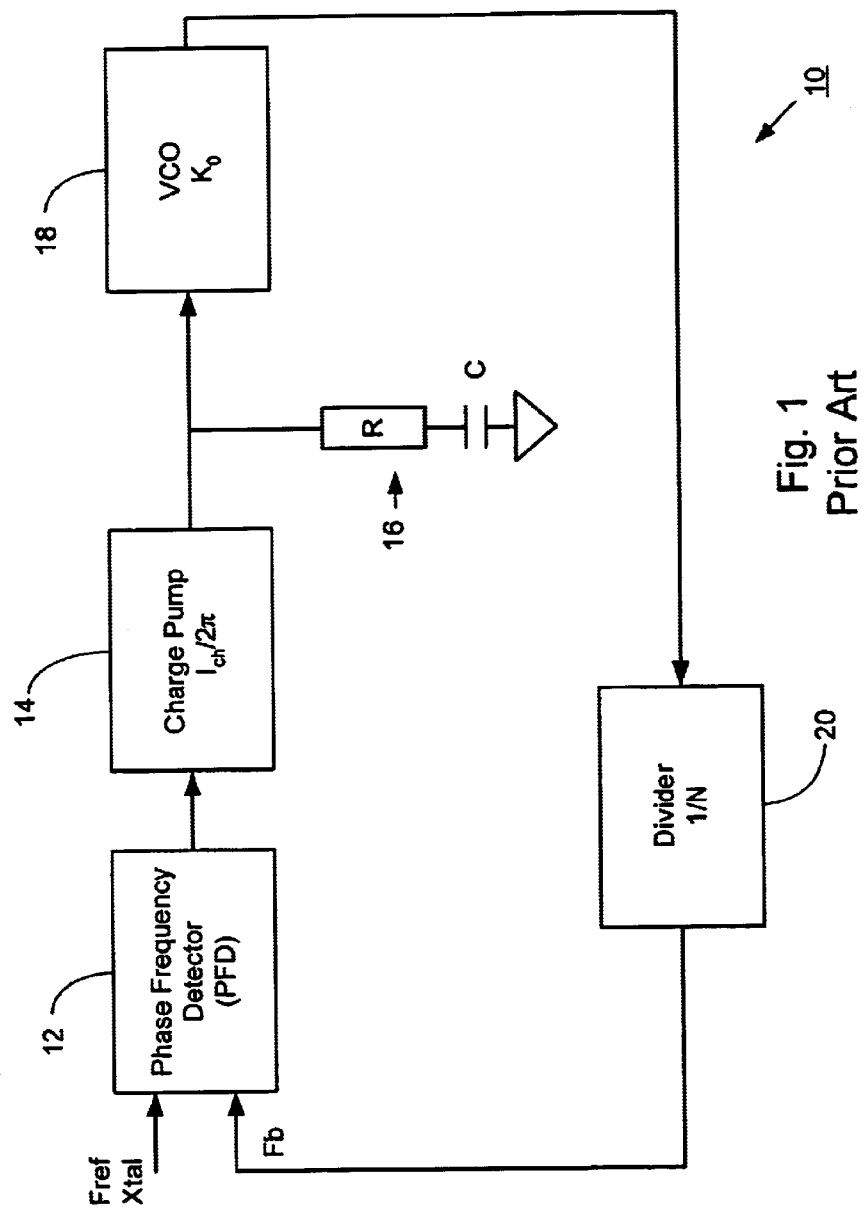
FIG. 1 illustrates a conventional phase locked loop.
Figure 2:
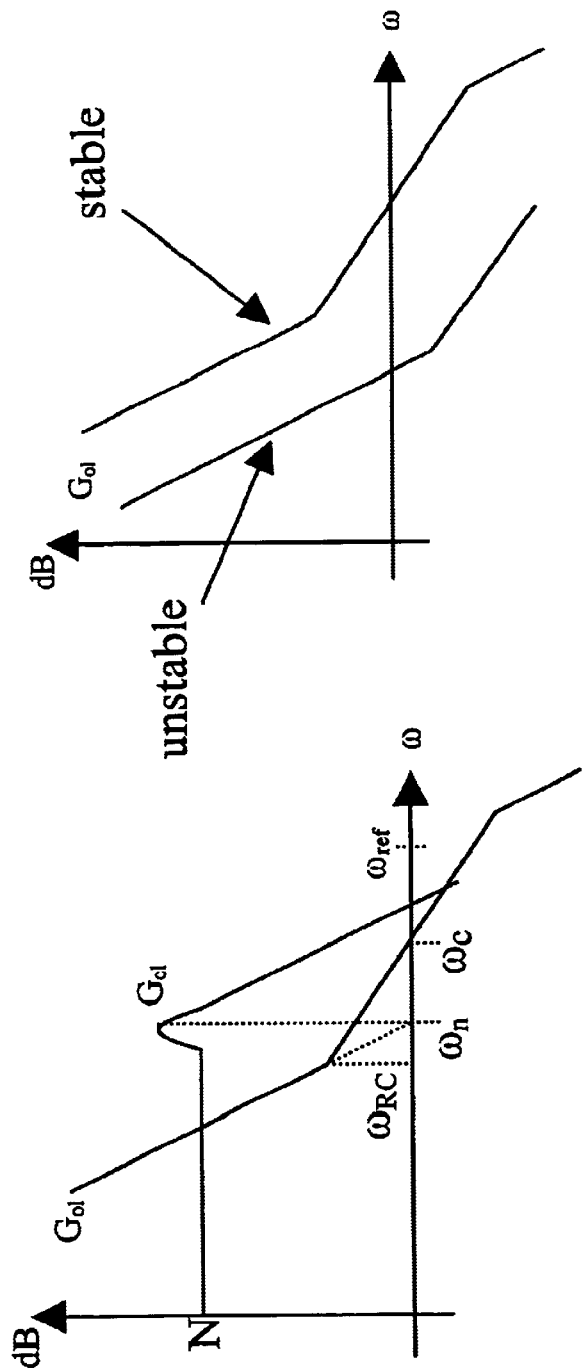
FIG. 2 is a Bode plot which illustrates the open loop gain and the closed loop gain for stable and unstable systems.
Figure 3:
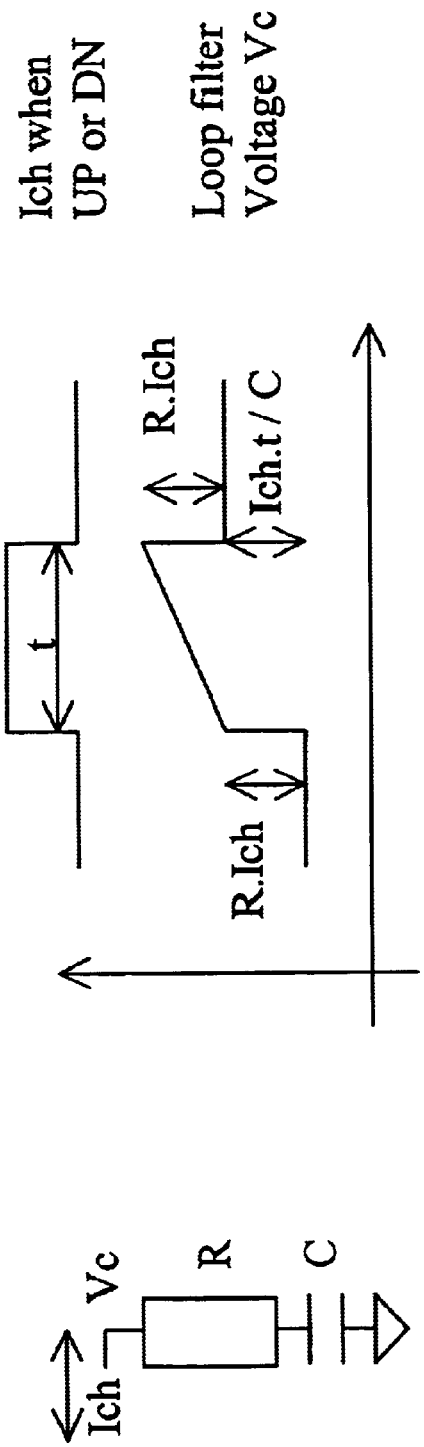
FIG. 3 illustrates a change of Ich over time.
Figure 4:
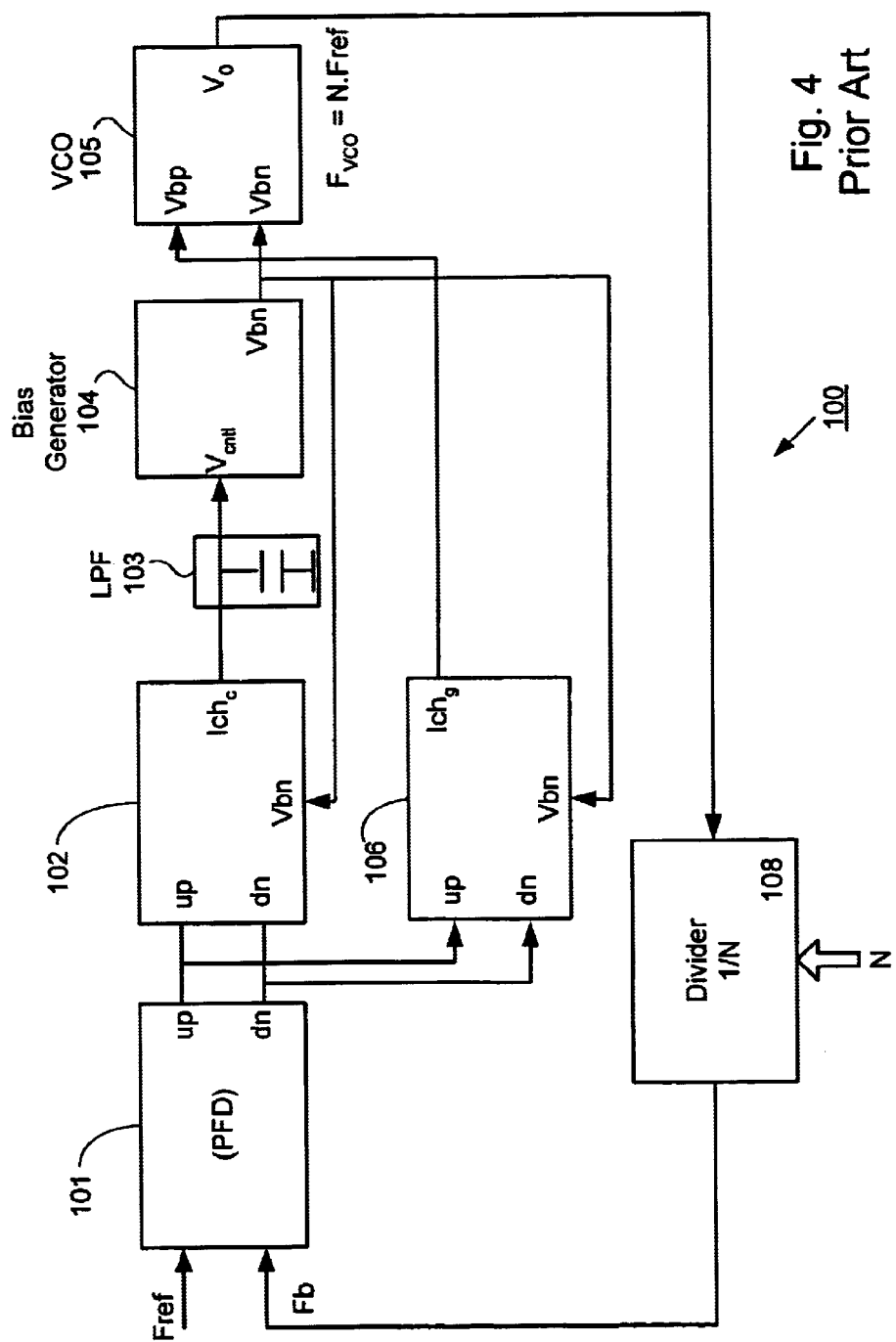
FIG. 4 illustrates a conventional self-biased PLL.
Figure 5:
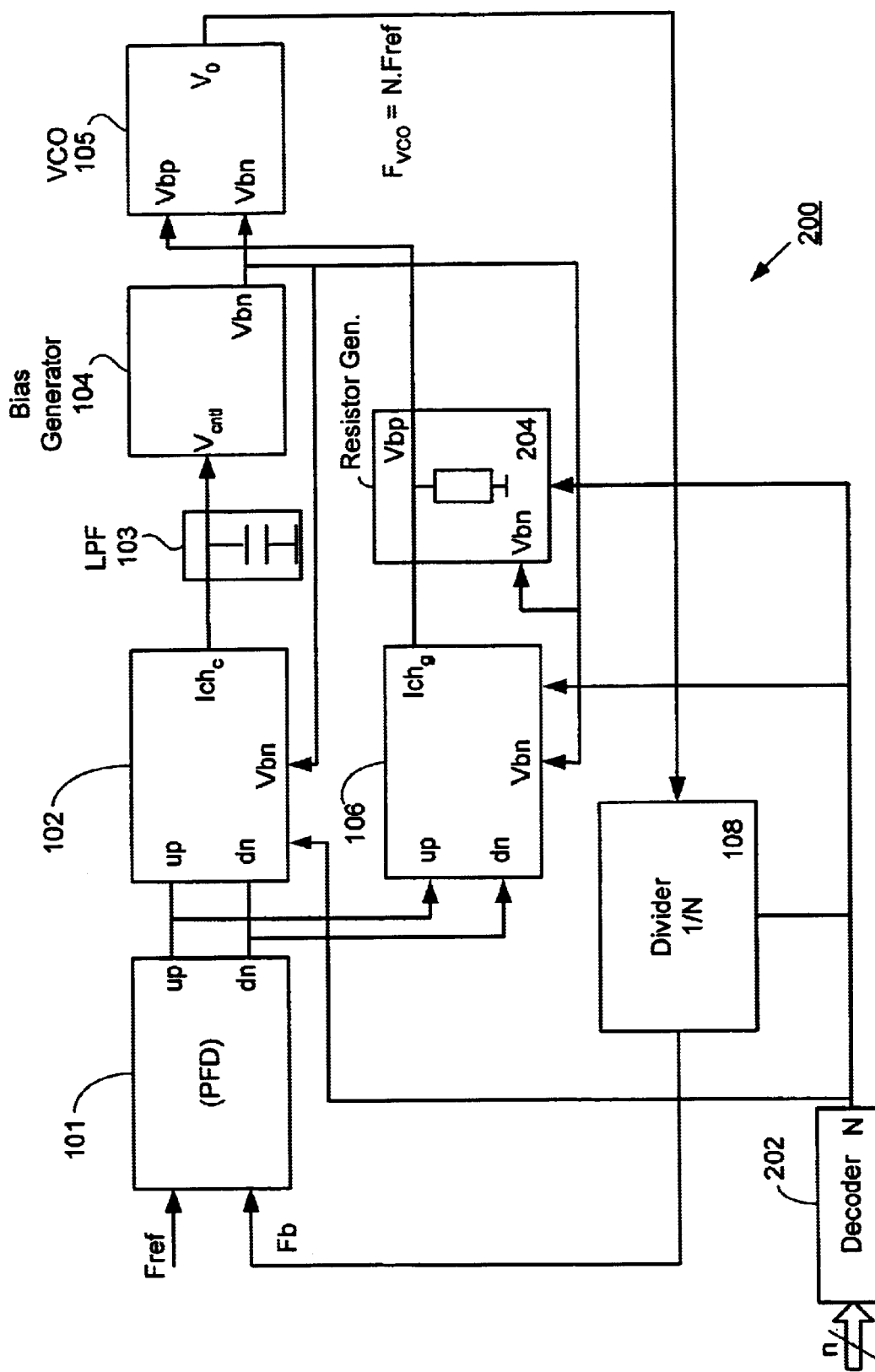
FIG. 5 illustrates a self-biased PLL in accordance with the present invention.

FIG. 5 is a block diagram of a PLL 200 in accordance with the present invention. The PLL 200 has the same elements as that of FIG. 4 and includes a decoder 202, provides inputs to the charge pumps 102 and 106, and the counter 108. The PLL 200 also includes a resistor generator 204 coupled between charge pump 106, and VCO 105. To provide a PLL for which changes in N can be taken into account the following equations must be rewritten:

$$F_{VCO} = \frac{\sqrt{2 \cdot k \cdot I_D}}{C_B}, K_0 = \frac{k}{C_B}$$

$$Ich = X \cdot (2 \cdot I_D) = \frac{\alpha}{N} \cdot (2 \cdot I_D)$$

$$R = \frac{Y}{\sqrt{8 \cdot k \cdot I_D}} = \frac{\beta \cdot N}{\sqrt{8 \cdot k \cdot I_D}}$$

Assuming Ich=$Ich_C$=$Ich_R$ $C_B$ is the equivalent VCO buffer load capacitance.

k is the VCO PMOS load process transconductance.

The damping factor and loop bandwidth, $$\zeta = \frac{\beta}{4} \cdot \sqrt{\alpha} \cdot \sqrt{\frac{C}{C_B}}$$

$$\frac{w_n}{w_{ref}} = \frac{1}{2\pi} \cdot \sqrt{\alpha} \cdot \sqrt{\frac{C_B}{C}}$$

Both damping factor and bandwidth to operating frequency ratio are constant with N and $\omega_{ref}$.

Figure 6:
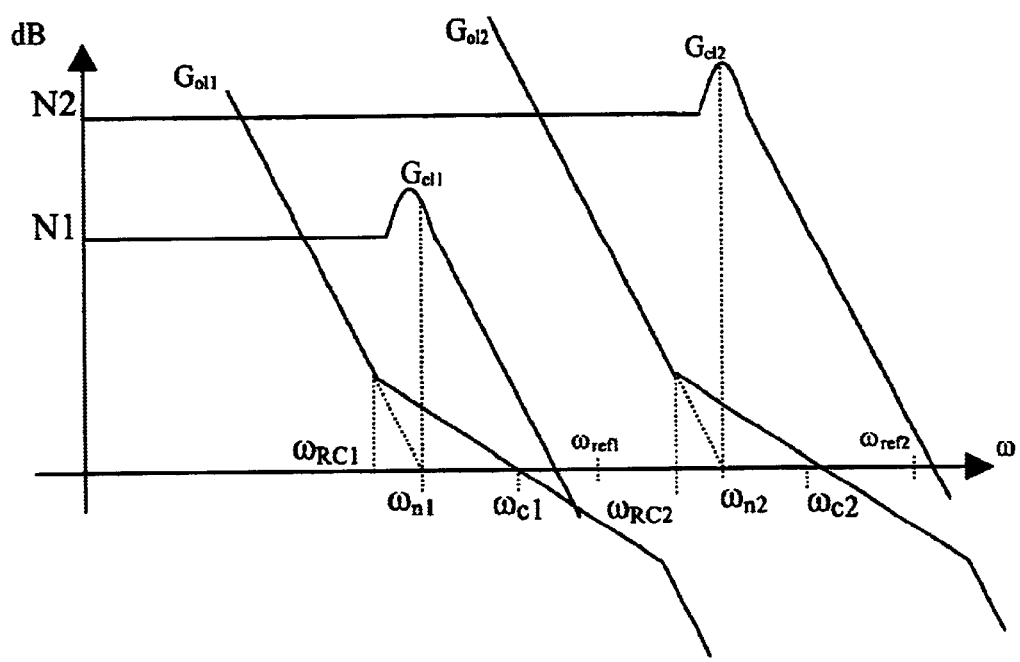
FIG. 6 is a Bode plot illustrating the tracking with N.

FIG. 6 illustrates an example with $$N_2 > N_1, w_{ref2} > w_{ref1}, \frac{w_{n2}}{w_{ref2}} = \frac{w_{n1}}{w_{ref1}}, \zeta_2 = \zeta_1$$

Condition Where Charge Pump Currents are Different

In the case where $Ich_C \neq Ich_R$ is considered, then:

Open loop gain:

$$G_{ol} = \frac{Ich_C \cdot K_0 \cdot \left(1 + \frac{Ich_R}{Ich_C} RCs\right)}{Cs^2}$$

The closed loop gain is then a second-order system $$G_{cl} = \frac{N \cdot Ich_C \cdot K_0 \cdot \left(1 + \frac{Ich_R}{Ich_C} RCs\right)}{NCs^2 + Ich_C \cdot K_0 \cdot \left(1 + \frac{Ich_R}{Ich_C} RCs\right)} = N \cdot \frac{1 + 2 \cdot \zeta \cdot (s/w_n)}{1 + 2 \cdot \zeta \cdot (s/w_n) + (s/w_n)^2}$$

$$\zeta = \frac{RCw_n \cdot \frac{Ich_R}{Ich_C}}{2} = \frac{R}{2} \cdot \sqrt{\frac{Ich_R \cdot K_0 \cdot C}{N}}$$

Loop damping factor $$w_n = \sqrt{\frac{Ich_C \cdot K_0}{NC}}$$

Loop bandwidth
The traditional stability becomes $$w_n > w_{RC} = \frac{1}{RC}, \text{ then } \zeta > 0.5 \frac{Ich_R}{Ich_C} \text{ because } \frac{w_n}{w_{RC}} = \frac{w_c}{w_n} = 2 \cdot \zeta \cdot \frac{Ich_R}{Ich_C}$$

The VCO overload limit is $$R \cdot Ich_R < \frac{F_{VCO}}{K_0} \text{ that leads to } \frac{w_n}{w_{ref}} < \frac{1}{4\pi\zeta} \sqrt{\frac{Ich_C}{Ich_R}}$$

Accordingly, $$F_{VCO} = \frac{\sqrt{2 \cdot k \cdot I_D}}{C_B}, K_0 = \frac{k}{C_B},$$

$$Ich_C = X_C \cdot (2 \cdot I_D) = \frac{\alpha_C}{N} \cdot (2 \cdot I_D),$$

$$R = \frac{Y}{\sqrt{8 \cdot k \cdot I_D}} = \frac{\beta \cdot N}{\sqrt{8 \cdot k \cdot I_D}}$$

$$Ich_R = X_R \cdot (2 \cdot I_D) = \frac{\alpha R}{N} \cdot (2 \cdot I_D)$$

VCO overload limit becomes $X_R \cdot Y < 2$
Charge pump current versus loop PLL or resistor design limit becomes $X_R \cdot Y < 1$
Accordingly, $$\zeta = \frac{\beta}{4} \cdot \sqrt{\alpha_R} \cdot \sqrt{\frac{C}{C_B}}$$

$$\frac{w_n}{w_{ref}} = \frac{1}{2\pi} \cdot \sqrt{\alpha_C} \cdot \sqrt{\frac{C_B}{C}}$$

In a preferred embodiment a two bit input n into the decoder 202 would adjust the counter by 4 bits (N) to adjust the frequency range, as has been mentioned. Ich changes with N accordingly, the loop bandwidth and damping factors can be effectively tracked. Accordingly, the decoder can be programmable to align the phase of the input frequency and the output frequency to ensure stability.

Accordingly, referring back to FIG. 5, the decoder 202 receives the application-dependent number N (representing the ratio between the output frequency and the application-dependent input frequency to the PLL system 200) and then adjusts the charge pump 102 and 106, the counter 108 and the resistor generator 204 to ensure that the self-biased PLL 200 operates within the frequency range associated with N. In so doing, a self-biased PLL 200 can be operated over a range of frequencies merely by adjusting the above-identified items in a manner that ensures stability over the range.

Utilizing this system more flexibility is provided on damping and bandwidth that can vary independently from each other.

Conclusion

The present invention offers a number of advantages over conventional/prior approaches. These include wide range PLL, self-biased, self-adaptive (bandwidth and damping tracking). Both damping factor and bandwidth to operating frequency ratio are constant with N and the input frequency $\omega_{ref}$. The system has low power usage: less than 4 mW at maximum frequency operation. The system facilitates easy power-down mode by turning off the integral loop filter voltage. It is easy to add more programmability if needed (bandwidth, damping). The cumbersome loop filter capacitor is fixed and its ratio to the equivalent buffer load is the only process dependency. It can be reasonably matched in layout (gate capacitances). The system is well suited for any charge-pump PLL. An additional advantage is that there is no bandgap reference.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A self-adaptive method for controlling a self-biased PLL system, the method comprising the steps of:
    (a) providing an application-dependent input reference frequency;
    (b) providing a variable application-dependent number N where N is a decimal number representing the ratio between an output frequency and the application-dependent input frequency to the PLL systems;
    (c) synthesizing an output signal whose frequency is N times that of the application-dependent input reference frequency by a phase locked loop (PLL);
    (d) generating a first charge pump output signal in response to a phase-frequency detector output signal by a first charge pump coupled to a phase-frequency detector; and
    (e) generating a second charge pump output signal in response to the phase-frequency detector output signal by a second charge pump coupled to said phase-frequency detector, wherein the second charge pump has an effective resistance suitable for adjusting a bandwidth and a damping factor that are each tracked with respect to any of a number of process or voltage or temperature variations.

2. The method of claim 1, further comprising:
    (f) aligning the application-dependent frequency input reference signal having a reference phase with a feedback signal having a feedback phase.

3. The method claim 1, further comprising:
    (g) generating a decoded output representing the application-dependent number N between the said output frequency and the said input frequency.

4. The method of claim 1, further comprising:
    (h) comparing the reference phase and the feedback phase; and
    (i) generating a phase-frequency detector output signal that is proportional to a difference between the reference phase and the feedback phase based upon the comparing (h).

5. The method of claim 1, further comprising:
    (k) filtering the first charge pump output signal by a loop filter coupled to said first charge pump, thereby producing an integral control voltage.

6. A self-biased PLL system comprising:
    a detector for comparing a reference frequency to a feedback frequency, at least one charge pump coupled to a phase detector;

a filter coupled to the at least one charge pump;

a bias generator coupled to the filter and to the at least one charge pump;

a voltage controlled oscillator (VCO) coupled to the bias generator;

a counter coupled to the VCO and the phase detector, for providing the feedback frequency; and a decoder for controlling the counter and the at least one charge pump, wherein the self-biased PLL is suitably disposed to be utilized at a plurality of frequencies.

7. The system of claim 6 wherein a bandwidth and a damping factor is each tracked with respect to process, voltage and temperature variations.

8. The system of claim 6 wherein the decoder allows a ratio (N) between an output frequency and an input frequency to be variable and application dependent.

9. The system of claim 7 wherein an application dependent frequency phase is aligned with a feedback frequency phase.

10. The system of claim 9 wherein a phase frequency detector provides a phase frequency detector output signal that is proportional to a difference between the reference phase and the feedback phase.

11. The system of claim 9, further comprising a first charge pump of the at least one charge pump arranged to provide a first charge pump output signal in response to the phase-frequency detector output signal.

12. The system of claim 9, wherein the filter produces an integral control voltage.

13. The system of claim 9, further comprises a second charge pump of the at least one charge pump coupled to said phase-frequency detector for generating a second charge pump output signal in response to the phase-frequency detector output signal, said second charge pump having an effective resistance for adjusting a bandwidth and a damping factor.

\* \* \* \* \*